(12) United States Patent
Lasserre et al.

(10) Patent No.: US 12,143,130 B2
(45) Date of Patent: Nov. 12, 2024

(54) METHODS AND DEVICES FOR MULTI-POINT DIRECT CODING IN POINT CLOUD COMPRESSION

(71) Applicant: BlackBerry Limited, Waterloo (CA)

(72) Inventors: Sébastien Lasserre, Thorigné-Fouillard (FR); Jonathan Taquet, Talensac (FR)

(73) Assignee: BlackBerry Limited, Waterloo (CA)

( * ) Notice: Subject to any disclaimer, the term of this patent is extended or adjusted under 35 U.S.C. 154(b) by 114 days.

(21) Appl. No.: 17/798,205

(22) PCT Filed: Feb. 19, 2020

(86) PCT No.: PCT/EP2020/054359
§ 371 (c)(1),
(2) Date: Aug. 8, 2022

(87) PCT Pub. No.: WO2021/164861
PCT Pub. Date: Aug. 26, 2021

(65) Prior Publication Data
US 2023/0071581 A1 Mar. 9, 2023

(51) Int. Cl.
*H03M 5/00* (2006.01)
*H03M 7/30* (2006.01)

(52) U.S. Cl.
CPC .......... *H03M 7/70* (2013.01); *H03M 7/3066* (2013.01); *H03M 7/6011* (2013.01)

(58) Field of Classification Search
CPC .... H03M 7/70; H03M 7/3066; H03M 7/6011; H03M 7/3077; H03M 7/30; G06T 9/001; G06T 9/005; G06T 9/40
See application file for complete search history.

(56) References Cited

U.S. PATENT DOCUMENTS 11,361,472 B2 *  6/2022  Lasserre ............. H03M 7/3059
2003/0214502 A1  11/2003  Park et al.
(Continued)

FOREIGN PATENT DOCUMENTS

CN       103814396 A       5/2014
CN       104682966 A       6/2015
(Continued)

OTHER PUBLICATIONS

US Office Action dated Feb. 8, 2024; U.S. Appl. No. 18/145,908.
(Continued)

*Primary Examiner* — Jean B Jeanglaude
(74) *Attorney, Agent, or Firm* — Rowand LLP

(57) ABSTRACT

Methods and devices for coding point clouds using direct coding mode to code coordinates of a point within a sub-volume associated with a current node instead of a pattern of occupancy for child nodes. When direct coding is applied to two or more points in the sub-volume, the points are ordered based on one of their respective coordinate values in binary and pairwise coding of those coordinate values is carried out on a bit-by-bit basis starting from the most significant bit position. For example, the coordinate values relate to a direction in the Cartesian coordinate system, the location of the first point is represented by an x-direction coordinate value, a y-direction coordinate value and a z-direction coordinate value. The pairwise coding includes coding whether the bits are the same and, if so, coding the bit value.

20 Claims, 9 Drawing Sheets

(56) References Cited

U.S. PATENT DOCUMENTS

| | | |
|---|---|---|
| 2010/0085352 A1 | 4/2010 | Zhou et al. |
| 2015/0358631 A1 | 12/2015 | Zhang |
| 2017/0214943 A1 | 7/2017 | Cohen et al. |
| 2017/0347122 A1 | 11/2017 | Chou et al. |
| 2022/0191532 A1 | 6/2022 | Wang |

FOREIGN PATENT DOCUMENTS

| | | |
|---|---|---|
| EP | 3514969 | 7/2019 |
| EP | 3595180 | 1/2020 |
| WO | 2011103679 A1 | 9/2011 |
| WO | WO 2021/164861 | 8/2021 |

OTHER PUBLICATIONS

Notice of Allowance, U.S. Appl. No. 16/955,279, filed Sep. 28, 2022.

"SLAM with cartesian point clouds"—ROS Answers: Open Source Q&A Forum—https://answers.ros.org/question/255765/slam-with-cartesian-point-clouds—Oct. 19, 2020.

"Object for storing 3-D point cloud"—MATLAB—https://mathworks.com/help/vision/ref/pointcloud.html, Oct. 19, 2020.

PCT International Search Report and Written Opinion relating to PCT Application No. PCT/EP2020/054359 dated Nov. 4, 2020.

English Translation of Chinese Office Action dated May 6, 2023; Application No. 201980009025.9.

KR Application No. 10-2020-7023062; Office Action dated Jun. 17, 2024.

Oaquim Salvi et al.; 'Pattern Codification Strategies In Structured Light Systems'; Institute d'Informatica i Aplicacions, Universitat de Girona, Av. Lluis Santalo, s/n, E-17071 Girona, Spain; Received Mar. 6, 2023; accepted Oct. 2, 2003.

Cha Zhang et al; 'Point Cloud Attribute Compression With Graph Transform'; Microsoft Research; One Microsoft Way, Redmond, WA 98075.

EP Office Action dated Jul. 4, 2024, EP Application No. 20707206.7.

* cited by examiner

METHODS AND DEVICES FOR MULTI-POINT DIRECT CODING IN POINT CLOUD COMPRESSION

FIELD

The present application generally relates to point cloud compression and, in particular to methods and devices for improved compression of direct coded unordered points in point cloud compression.

BACKGROUND

Data compression is used in communications and computer networking to store, transmit, and reproduce information efficiently. There is an increasing interest in representations of three-dimensional objects or spaces, which can involve large datasets and for which efficient and effective compression would be highly useful and valued. In some cases, three-dimensional objects or spaces may be represented using a point cloud, which is a set of points each having a three coordinate location (X, Y, Z) and, in some cases, other attributes like colour data (e.g. luminance and chrominance), transparency, reflectance, normal vector, etc. Point clouds can be static (a stationary object or a snapshot of an environment/object at a single point in time) or dynamic (a time-ordered sequence of point clouds).

Example applications for point clouds include topography and mapping applications. Autonomous vehicle and other machine-vision applications may rely on point cloud sensor data in the form of 3D scans of an environment, such as from a LiDAR scanner. Virtual reality simulations may rely on point clouds.

It will be appreciated that point clouds can involve large quantities of data and compressing (encoding and decoding) that data quickly and accurately is of significant interest. Accordingly, it would be advantageous to provide for methods and devices that more quickly, efficiently and/or effectively compress data for point clouds.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
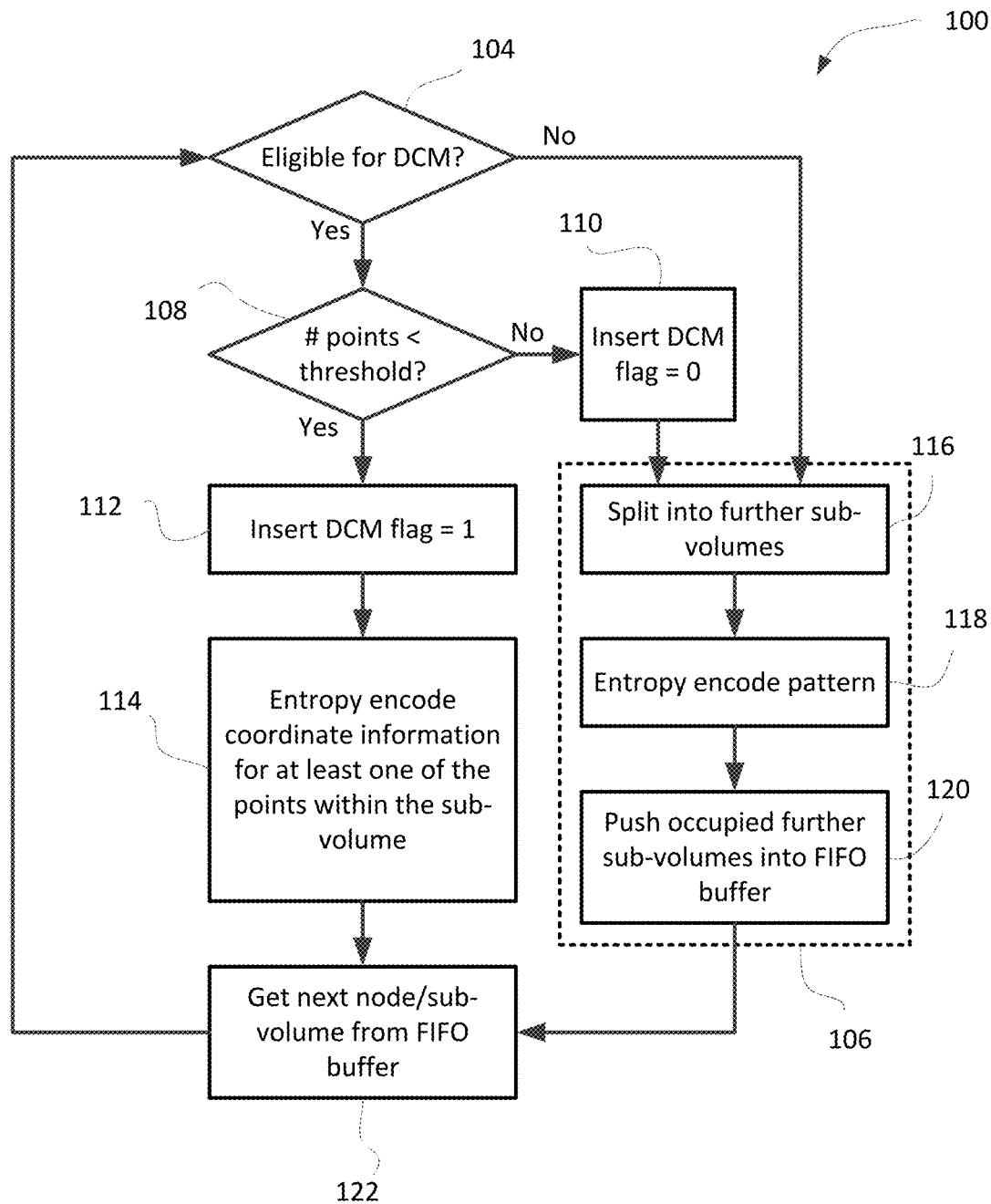
FIG. 1 shows, in flowchart form, one example method for encoding a point cloud using inferred direct coding mode.

The present application describes methods of encoding and decoding point clouds, and encoders and decoders for encoding and decoding point clouds. In general the present application describes methods and devices for coding point clouds using direct coding mode to code coordinates of two or more points within a sub-volume associated with a current node. Methods are described for compressed coding of directed coded points in a sub-volume. In some cases, coordinates for two or more unordered points in a sub-volume are coded by ordering the points based on respective coordinate values and then using pairwise coding of bits in corresponding positions in the respective coordinates.

In one aspect, the present application describes a method of encoding a point cloud to generate a bitstream of compressed point cloud data, wherein a current sub-volume contains a first point and a second point, the first point having a first location within the sub-volume defined by a first coordinate value and the second point having a second location within the sub-volume defined by a second coordinate value. The method may include ordering the first coordinate value and the second coordinate value wherein the first and second coordinate values are in binary; starting from a most significant bit position, pairwise encoding a current position of the first and second coordinate values by encoding a same bit flag indicating whether the bits in the current position in the first coordinate value and the second coordinate value are the same; when the bits in the current position are not the same, without encoding the bits in the current position, encoding any remaining bits of the first coordinate value and any remaining bits of the second coordinate value; when the bits in the current position are the same, then encoding a bit value flag indicating whether the bits are both one or both zero; and recursively repeating the pairwise encoding for a next position in the first and second coordinate values until the first and second coordinate values are encoded.

In some implementations, the ordering is from low to high. In some implementations, the ordering is from high to low.

In some implementations, encoding the same bit flag may include entropy encoding the same bit flag. In some cases, entropy encoding the same bit flag uses a dedicated context for entropy encoding of the same bit flag.

In some implementations, the first and second coordinate values correspond to direction in a Cartesian coordinate system. In some cases, the direction is an x-direction, y-direction, or z-direction.

In some implementations, the first location is further defined by a third coordinate value and the second location is further defined by a fourth coordinate value, the third and fourth coordinate values corresponding to a same direction in a coordinate system. The method may further include determining that the first coordinate value and the second coordinate value are the same, and, as a result ordering the third coordinate value and the fourth coordinate value, and recursively performing the pairwise encoding with respect to the third and fourth coordinate values until they are encoded.

In some implementations, the method may further include first determining that the sub-volume includes at least two points and determining that direct coding is to be applied to the at least two points. In some cases, determining that direct coding is to be applied may include determining that the number of points in the sub-volume is less than a threshold number. In some cases, the method may further include encoding a direct coding mode flag signaling that direct coding is used to encode the at least two points.

In another aspect, the present application describes a method of decoding a bitstream of compressed point cloud data to produce a reconstructed point cloud, wherein a current sub-volume contains a first point and a second point, the first point having a first location within the sub-volume defined by a first coordinate value and the second point having a second location within the sub-volume defined by a second coordinate value. The method may include starting from a most significant bit position, pairwise decoding a current position of the first and second coordinate values by decoding a same bit flag indicating whether the bits in the current position in the first coordinate value and the second coordinate value are the same; when the bits in the current position are not the same, reconstructing the bits in the current position and decoding any remaining bits of the first coordinate value and any remaining bits of the second coordinate value; when the bits in the current position are the same, then decoding a bit value flag indicating whether the bits in the current position are both one or both zero; recursively repeating the pairwise decoding for a next position in the first and second coordinate values until the first and second coordinate values are decoded; and outputting a reconstructed first coordinate value for the first point and a reconstructed second coordinate value for the second point.

In a further aspect, the present application describes encoders and decoders configured to implement such methods of encoding and decoding.

In yet a further aspect, the present application describes non-transitory computer-readable media storing computer-executable program instructions which, when executed, cause one or more processors to perform the described methods of encoding and/or decoding.

In yet another aspect, the present application describes a computer-readable signal containing program instructions which, when executed by a computer, cause the computer to perform the described methods of encoding and/or decoding.

Other aspects and features of the present application will be understood by those of ordinary skill in the art from a review of the following description of examples in conjunction with the accompanying figures.

At times in the description below, the terms "node" and "sub-volume" may be used interchangeably. It will be appreciated that a node is associated with a sub-volume. The node is a particular point on the tree that may be an internal node or a leaf node. The sub-volume is the bounded physical space that the node represents. The term "volume" may be used to refer to the largest bounded space defined for containing the point cloud. The volume is recursively divided into sub-volumes for the purpose of building out a tree-structure of interconnected nodes for coding the point cloud data.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . or . . . " is intended to cover any one or more of the listed elements, including any one of the listed elements alone, any sub-combination, or all of the elements, without necessarily excluding any additional elements, and without necessarily requiring all of the elements.

A point cloud is a set of points in a three-dimensional coordinate system. The points are often intended to represent the external surface of one or more objects. Each point has a location (position) in the three-dimensional coordinate system. The position may be represented by three coordinates (X, Y, Z), which can be Cartesian or any other coordinate system. The points may have other associated attributes, such as colour, which may also be a three component value in some cases, such as R, G, B or Y, Cb, Cr. Other associated attributes may include transparency, reflectance, a normal vector, etc., depending on the desired application for the point cloud data.

Point clouds can be static or dynamic. For example, a detailed scan or mapping of an object or topography may be static point cloud data. The LiDAR-based scanning of an environment for machine-vision purposes may be dynamic in that the point cloud (at least potentially) changes over time, e.g. with each successive scan of a volume. The dynamic point cloud is therefore a time-ordered sequence of point clouds.

Point cloud data may be used in a number of applications, including conservation (scanning of historical or cultural objects), mapping, machine vision (such as autonomous or semi-autonomous cars), and virtual reality system, to give some examples. Dynamic point cloud data for applications like machine vision can be quite different from static point cloud data like that for conservation purposes. Automotive vision, for example, typically involves relatively small resolution, non-coloured, highly dynamic point clouds obtained through LiDAR (or similar) sensors with a high frequency of capture. The objective of such point clouds is not for human consumption or viewing but rather for machine object detection/classification in a decision process. As an example, typical LiDAR frames contain on the order of tens of thousands of points, whereas high quality virtual reality applications require several millions of points. It may be expected that there will be a demand for higher resolution data over time as computational speed increases and new applications are found.

While point could data is useful, a lack of effective and efficient compression, i.e. encoding and decoding processes, may hamper adoption and deployment.

One of the more common mechanism for coding point cloud data is through using tree-based structures. In a tree-based structure, the bounding three-dimensional volume for the point cloud is recursively divided into sub-volumes. Nodes of the tree correspond to sub-volumes. The decision of whether or not to further divide a sub-volume may be based on resolution of the tree and/or whether there are any points contained in the sub-volume. A leaf node may have an occupancy flag that indicates whether its associated sub-volume contains a point or not. Splitting flags may signal whether a node has child nodes (i.e. whether a current volume has been further split into sub-volumes). These flags may be entropy coded in some cases and in some cases predictive coding may be used.

A commonly-used tree structure is an octree. In this structure, the volumes/sub-volumes are all cubes and each split of a sub-volume results in eight further sub-volumes/sub-cubes. Another commonly-used tree structure is a KD-tree, in which a volume (cube or rectangular cuboid) is recursively divided in two by a plane orthogonal to one of the axes. Octrees are a special case of KD-trees, where the volume is divided by three planes, each being orthogonal to one of the three axes. Both these examples relate to cubes or rectangular cuboids; however, the present application is not restricted to such tree structures and the volumes and sub-volumes may have other shapes in some applications. The division of a volume is not necessarily into two sub-volumes (KD-tree) or eight sub-volumes (octree), but could involve other divisions, including division into non-rectangular shapes or involving non-adjacent sub-volumes.

The present application may refer to octrees for ease of explanation and because they are a popular candidate tree structure for automotive applications, but it will be understood that the methods and devices described herein may be implemented using other tree structures, or coding structure other than trees.

The recursive coding of a tree structure often involves partitioning an occupied sub-volume into further sub-volumes and encoding the occupancy status of each of those further sub-volumes. There are various techniques for coding occupancy bits and determining context for coding those occupancy bits, or collectively an occupancy "pattern", i.e. sequence of eight bits corresponding to eight sub-volumes of an octree-based partitioning.

One of the problems with compressing point cloud data in a tree-structure is that it does not necessarily deal with isolated points very well. The recursive splitting of the sub-volume and the location of points within the split sub-volumes involves computational burden and time, and the signaling of recursive splitting of sub-volumes to pinpoint the location of one or a few isolated points can be costly in terms of bandwidths/memory storage, as well as computational time and resources. Furthermore, isolated points "pollute" the distribution of patterns, inducing many patterns with only one occupied child, thus changing the balance of the distribution and penalizing the coding of other patterns.

Accordingly, in some cases an encoder and decoder may directly code positional information for isolated points. The direct coding of a point's position, e.g. its spatial coordinates within a volume or sub-volume, is termed Direct Coding Mode (DCM). It would be highly inefficient to use DCM for all points. One option is to signal, for each occupied node, using a dedicated flag, whether DCM will be used for any points within that node. Another option is to assess a set of criteria for whether a node is "eligible" to use DCM and only code the DCM flag if the node is eligible. Such a technique was described by the present applicant in PCT Patent Publication WO/2019/140508, entitled "Methods and Devices Using Direct Coding in Point Cloud Compression", the contents of which are hereby incorporated by reference. In the art, these techniques may be referred to as Inferred Direct Coding Mode (IDCM).

The use of IDCM has proven valuable in that it results in lowered complexity of point cloud data coding for sparse data sets. Using IDCM, fewer total nodes are coded due to early truncation of a branch to direct code a point position. IDCM decoded points are quickly available for further processing. The bypass coding of point coordinate values is less complex than entropy coding of occupancy flags, thereby speeding up computation at the encoder and decoder. This is particularly useful in applications such as automotive vision, e.g. LiDAR-based scanning.

In order to ensure IDCM does not significantly negatively impact compression of the point cloud data, eligibility criteria are carefully selected. One explicit condition for use of direct coding is that the current sub-volume contain fewer than a threshold number of points. That threshold may be set to two, three, or some other value. IDCM also employs implicit conditions that look at the occupancy status and other factors relating to neighbouring sub-volumes at the same coding depth, the parent depth or grandparent depth.

The need to access parent or grandparent level occupancy information for eligibility assessments may impose significant computation and memory burden on both the encoder and decoder. Moreover, due to the eligibility criteria, IDCM does not prune the tree as much as DCM without eligibility criteria could, resulting in more nodes to track than DCM. It is observed that the speed of coding a point cloud is directly related to the number of nodes processed and potentially involved in eligibility determinations, since they involve a memory footprint too large to rely on cache memory. The memory access operation may be a significant bottleneck in speed of the encoding and decoding process. Within reasonable bounds, the computation burden inside a processed node impacts the total processing time at a second order.

Accordingly, a lever to decrease the encoding and decoding time is to reduce the number of processed nodes, for example by improving the pruning of the tree.

An option is to eliminate the implicit eligibility conditions that evaluate occupancy information for nearby volumes and rely solely on the explicit threshold criteria as the condition for enabling DCM. That is, the use of DCM may be conditional on the number of points within a sub-volume being below the threshold value, without considering additional implicit criteria. This simplification of the eligibility criteria may result in a significant increase in the use of DCM and a resulting decrease in encoding and decoding complexity through reduction in overall number of nodes coded; however, the increased use of DCM has a negative impact on compression performance.

To offset the negative impact on compression from increased use of DCM, the present application describes methods of encoding and decoding the DCM coordinate values that may improve compression performance in the case where a sub-volume contains at least two points. In some examples, the improved compression performance more than offsets the negative impact of increased DCM usage, such that the resulting coding performance is at least as good in terms of compression (measured in bits-per-point) and is significantly faster. In some cases, the speed of coding is increased by and order of magnitude. The coding of DCM coordinate values in a multi-point situation may be improved by exploiting the fact that they are un-ordered points. That is, the order in which two (or more) points are direct coded does not matter to the encoder and decoder. Accordingly, as will be described further below, in a sub-volume containing two or more points, corresponding coordinate values for the two or more points may be ordered from low to high, and pairwise coding applied to bit pairs from the two values to improve coding compression.

Before describing the coding of coordinate values in DCM, the IDCM process from PCT Publication WO 2019/140508 is described.

Reference is now made to FIG. 1, which shows, in flowchart form, one example method 100 of encoding a point cloud using IDCM. The method 100 in this example involves recursive splitting of occupied nodes (sub-volumes) and a breadth-first traversal of the tree for coding. In operation 104, with regard to a current occupied node, e.g. a current sub-volume associated with a node of the tree occupied by at least one point, the encoder assesses whether that sub-volume is eligible for DCM. If not, then in operation 106 the node is split and coded in accordance with the usual tree-coding process. That is, in at least this example, the sub-volume is split into child sub-volumes, as indicated by operation 116, and the pattern of occupancy of those child sub-volumes is entropy encoded in operation 118. In operation 120, any of those child sub-volumes that are occupied by at least one point are buffered to be further split/encoded (put in a FIFO buffer). Although not explicitly illustrated, it will be appreciated that the method 100 incorporates a stopping condition, like maximum tree depth, after which it will not further split the sub-volumes.

If, in operation 104, the node is evaluated and it is determined that the node is eligible for DCM, then in operation 108 the number of points contained with that sub-volume is assessed against a threshold. If the number of points in the sub-volume is less than the threshold, then DCM is used. If the number of points is equal to or greater than the threshold, then DCM is not used. The threshold is set in advance and may be hard coded or user determined. It may be communicated from encoder to decoder in header information. The threshold may be 2 or more. It will be appreciated that the evaluation may be modified to enable DCM if the number is less than or equal to the threshold, and the threshold may be set one point lower in that case to realize the same result. In any event, if DCM is not used, then in operation 110 a DCM flag set to negative (may be signaled as value 0 in some implementations) and is output in the bitstream to inform the decoder that DCM is not to be used in this sub-volume. The method 100 then loops to operation 106 to split and encode the sub-volume in the usual manner.

If DCM is to be used, then in operation 112 the DCM flag is set positive (which may be a value of 1 in some implementations) and in operation 114 at least some of the points within the sub-volume are encoded through encoding their coordinate positions within the sub-volume. This may include encoding X, Y and Z Cartesian coordinate positions relative to a corner of the sub-volume in some implementations. The corner may be the sub-volume vertex closest to the original of a coordinate system, for example. Various techniques for encoding coordinates may be applied, including prediction operations, differential coding, etc., depending on the implementation.

Operation 114 is described above as encoding at least some of the points rather than all of the points since, in some possible implementations, a rate-distortion optimization process may be applied to assess whether the rate cost of DCM coding a point exceeds the distortion cost of not coding the point. Note that if such an RD optimization evaluation impacts whether the parent node would have been "occupied", then the RD optimization may need to be performed earlier in the coding process and/or the process may involve two-pass coding.

Once the node has been encoded, either through use of DCM or through conventional encoding of the pattern, then the method 100 obtains the next occupied node/sub-volume from the FIFO buffer, as shown by operation 122, and cycled back to assess whether that node/sub-volume is eligible for DCM. As noted above, a stopping condition will eventually halt further sub-division of the sub-volumes and all nodes in the FIFO will have been processed.

The eligibility assessment in operation 104 is based on occupancy data for previously-coded nodes. This allows both the encoder and decoder to independently make the same determination of eligibility.

Figure 2:
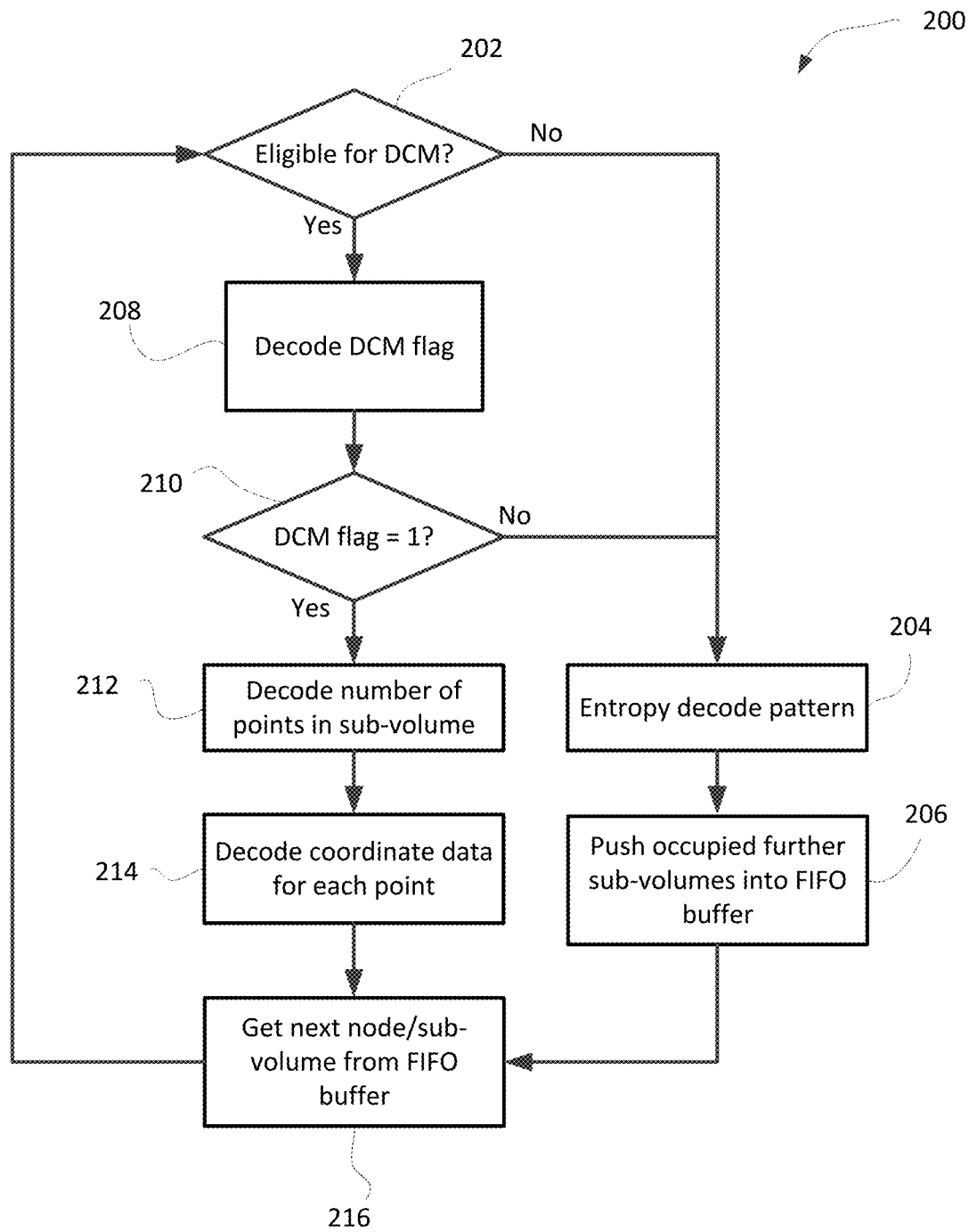
FIG. 2 shows, in flowchart form, one example method for decoding encoded point cloud data using inferred direct coding mode.

Reference is now made to FIG. 2, which shows, in flowchart form, one example method 200 for decoding a bitstream of encoded point cloud data using IDCM.

In operation 202, the decoder evaluates whether a current occupied node of the tree of point cloud data is eligible for DCM. The decoder uses the same eligibility determination used by the encoder. In general, the eligibility determination is based on some occupancy data from sibling or neighbouring nodes, examples of which are described above.

If the node is not eligible, then the decoder splits the node and entropy decodes the pattern of occupancy in operation 204 and then pushes any occupied child nodes into the FIFO buffer in operation 206. However, if the node is eligible for DCM, then the decoder decodes the DCM flag in operation 208. The decoded DCM flag indicates whether or not DCM was actually used for encoding points in the current node, as shown by operation 210. In this example, a DCM flag value of 1 corresponds to use of DCM and a flag value of 0 corresponds to not using DCM. If the DCM flag indicates that DCM was not used, then the method 200 proceeds to operations 204 and 206 to decode the pattern as per usual. If the DCM flag indicates that DCM was used, then in operation 214 the decoder decodes the coordinate point data for any points in the node.

If the encoder and decoder are configured to use DCM in the case of more than one point per node, then in operation 212 the decoder decodes the number of points. It will be appreciated that this value may be encoded as the number less one since it is known that the value must be one or more. Once the decoder knows the quantity of encoded points, it then decodes the coordinate data for each of the points in operation 214.

After the decoder has either decoded the pattern or decoded the point coordinate data, it then gets, in operation 216, the next occupied node from the FIFO buffer and returns to operation 202 to assess its eligibility for DCM coding.

It will be appreciated that the IDCM process described above involves assessing eligibility, then coding a DCM flag to signal whether DCM is being used or not, and then encoding the number of points (if the threshold permits use of DCM in the case of two or more points) and the coordinate values for each point. In accordance with one aspect of the present application, the eligibility assessment is eliminated and, if the sub-volume includes at least two points to be directly coded, then the coding of at least one pair of coordinate values involves ordering the coordinate values and applying a bit-position-based pairwise encoding of the bits of the coordinate values.

Figure 3:
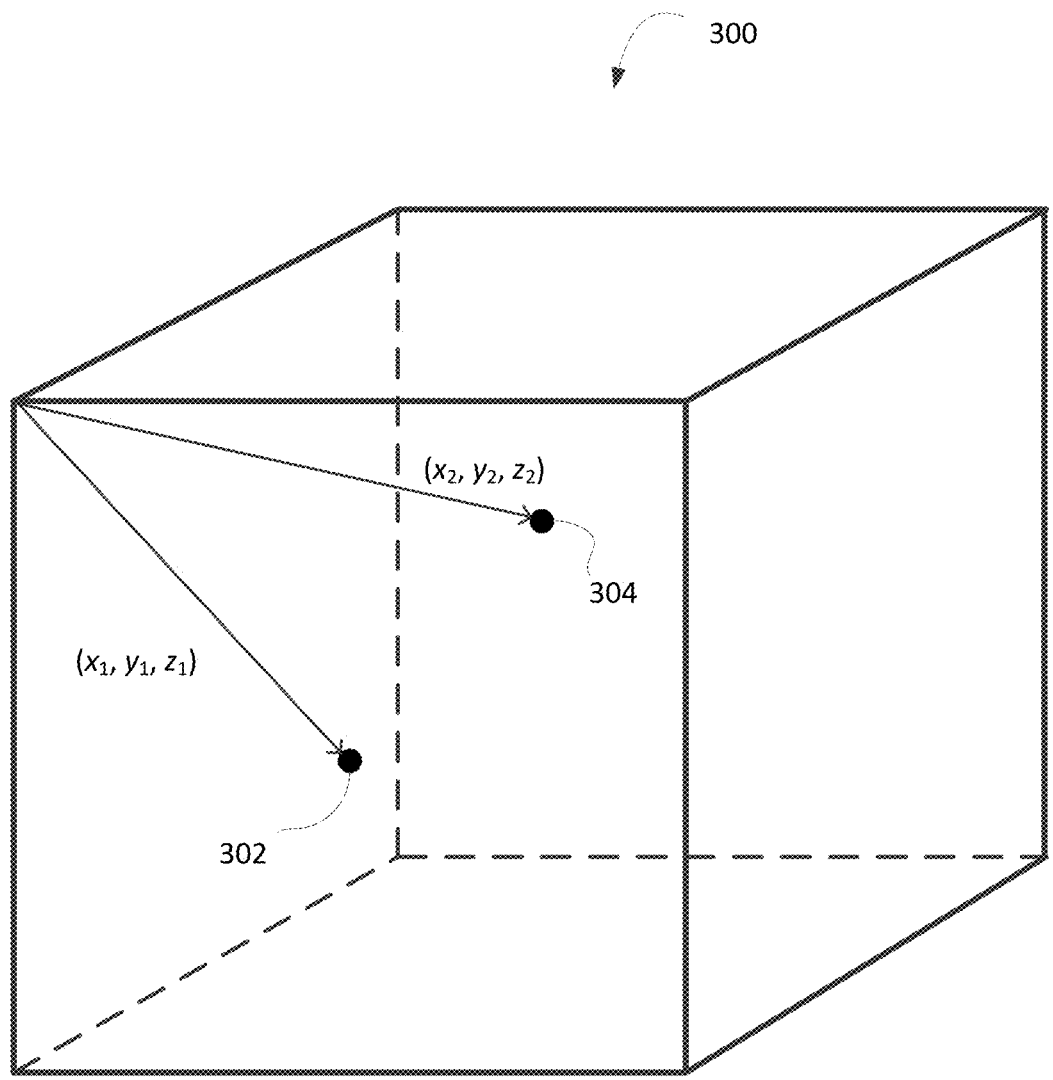
FIG. 3 shows an example sub-volume containing two points.

Reference will now be made to FIG. 3, which shows an example sub-volume 300 containing two points: a first point 302 and a second point 304. The first point 302 is located at a position that may be defined using Cartesian coordinates $(x_1, y_1, z_1)$ relative to a coordinate system origin point. In this example, the origin point is a vertex of the sub-volume 300. Similarly, the second point 304 is located at a position defined by $(x_2, y_2, z_2)$.

When DCM is applied to the sub-volume 300, the location of each of the points is coded by directly coding the coordinates for the position of the points. That is, the coordinate values, $x_1, y_1, z_1$, are each encoded. At the decoder, when a DCM flag is decoded that indicates that one or more points are DCM coded, then the decoder determines the number of points and then decodes, for each point, the three coordinate values that define that point's coordinate position.

The coordinate values may be expressed in binary. The length of the binary coordinate value may depend on the depth of the sub-volume and the resolution of the point cloud, i.e. the maximum depth of the coding tree. Each of the coordinate values relates to a direction in the coordinate system. For example, in this example involving Cartesian coordinates, the location of the first point is represented by an x-direction coordinate value, $x_1$, a y-direction coordinate value, $y_1$, and a z-direction coordinate value, $z_1$.

The points are "un-ordered" in the sense that the encoding and decoding processes do not depend on whether the location of the first point or the location of the second point are coded first. This property may be exploited to gain improved compression in coding the coordinate values, as will be explained below.

In the example case of two points, starting with one of the coordinate directions, such as the x-direction, the two points may be ordered based on ordering the x-direction coordinates from low to high. That is, they are ordered so as to ensure that $x_1$ is less than or equal to $x_2$. The two x-direction coordinate values, in binary, may be expressed as:

$x_1$: $b_{11} b_{12} b_{13} \ldots b_{1n}$, where n is the number of bits in $x_1$.
$x_2$: $b_{21} b_{22} b_{23} \ldots b_{2n}$, where n is the number of bits in $x_2$.

The points are ordered such that $x_1 \le x_2$. The examples described herein are based on an ordering of coordinate values from low to high. It will be appreciated that in some implementations, the ordering may be from high to low.

Starting from the most-significant bit position, i.e. containing bits $b_{11}$ and $b_{21}$, the bits will have the values (0,0), (0,1) or (1,1). The pair of bits cannot result in the values (1,0) since the points have been ordered to ensure that $x_1 \le x_2$. Accordingly, the encoder may encode a same bit flag to signal whether the two bits, $b_{11}$ and $b_{21}$, are the same or not. If not, then the decoder knows they must be (0,1). If they are the same, then the encoder encodes a bit value flag to signal whether they are both 0 or both 1. In practice, the bit value flag may be simply encoding the binary value of the bits, i.e. that they are 0 or that they are 1.

In this manner, the two bits are encoded using one bit or two bits, depending on whether they are identical or not. If the two bits $b_{11}$ and $b_{21}$ are not identical, then after coding the same bit flag to signal that the bits are (0, 1), then encoder encodes the remaining bits of each of the coordinate values $x_1$ and $x_2$ using bypass coding. If the two bits $b_{11}$ and $b_{21}$ are identical, then the pair of bits in the next bit position, e.g. $b_{12}$ and $b_{22}$, undergo the same pairwise encoding process.

Figure 4:
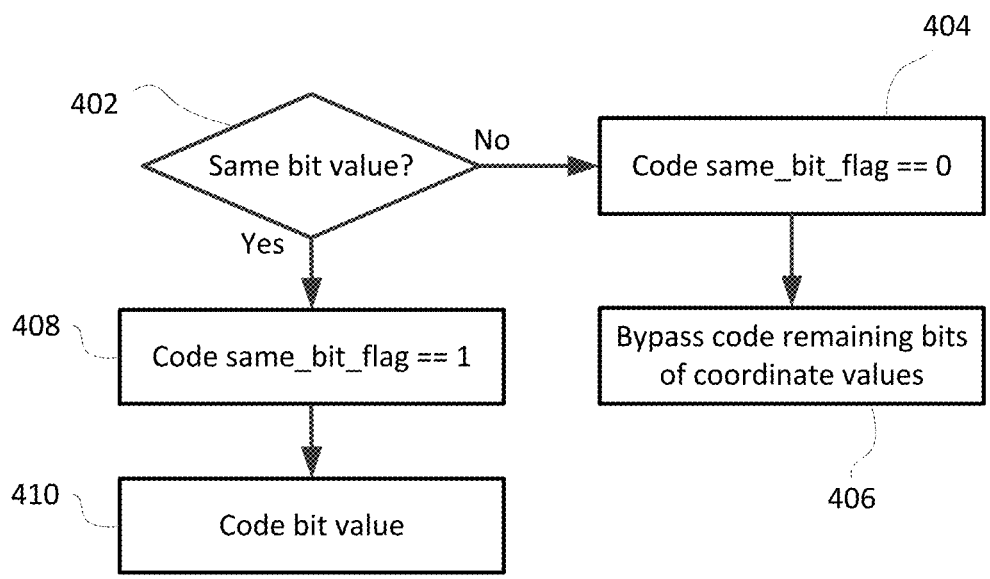
FIG. 4 shows a simplified flowchart illustrating a pairwise encoding process for a pair of coordinate values.

Reference is now made to FIG. 4, which shows a simplified flowchart 400 illustrating the pairwise encoding process for a pair of coordinate values. The coordinate values may be the x-direction coordinates, the y-direction coordinates, or the z-direction coordinates in the case of a Cartesian coordinate system. Starting from a most significant bit position for each of the coordinate values, the bits in that bit position are compared and the encoder determines whether they are the same in operation 402. If not, then the encoder encodes a same bit flag in operation 404 to signal that they are not the same. This implies that the bits are (0, 1) since they cannot be (1, 0) due to the ordering of the coordinate values. In some implementations the fact that the bits are different from each other is signaled by setting the same bit flag to zero. The encoder then bypass encodes the remaining bits of the two coordinate values, e.g. bits $b_{12}$ to $b_{1n}$ and bits $b_{22}$ to $b_{2n}$, as indicated by operation 406.

If the two bits from the current bit position in the coordinate values are the same, then in operation 408 the same bit flag is set to signal that they are the same and it is encoded. In some cases, the same bit flag may be set to 1 to signal that the two bits are the same. The encoder then codes the bit value in operation 410 to signal whether the two bits are both 0 or both 1.

The pairwise encoding process then returns to operation 402 to evaluate the two bits in the next (subsequent) bit position, e.g. bits $b_{12}$ and $b_{22}$.

Direct coding mode is usually applied in the case of sparsely populated sub-volumes. The condition for application of DCM is typically that the number of points within a sub-volume is less or equal to a threshold, where the threshold may be two or three in some examples. Nevertheless, it has been found that despite the fact that the points are in a sparsely populated sub-volume, there is a non-negligible spatial correlation between two points in the sub-volume. That correlation impacts the likelihood that the two respective coordinate values for the two points are similar, i.e. the probability that corresponding bits of those coordinate values are the same. Accordingly, further compression gains may be achieved through use of entropy encoding of the same bit flag. Context adaptive binary entropy coding may be used, for example using a CABAC (context-adaptive binary arithmetic coding) engine. A dedicated context may be allocated to coding the same bit flag.

In some instances, all bits of the first and second coordinate values may be identical. That is, $x_1$ may be equal to $x_2$. Having undergone the pairwise encoding process, if the two coordinate values are equal, then the coordinate values corresponding to another coordinate direction may be coded using the pairwise coding process. For example, if $x_1 = x_2$, then the encoder may order the coordinate values $y_1$ and $y_2$ and may apply the above-described pairwise coding process to those coordinate values.

Figure 5:
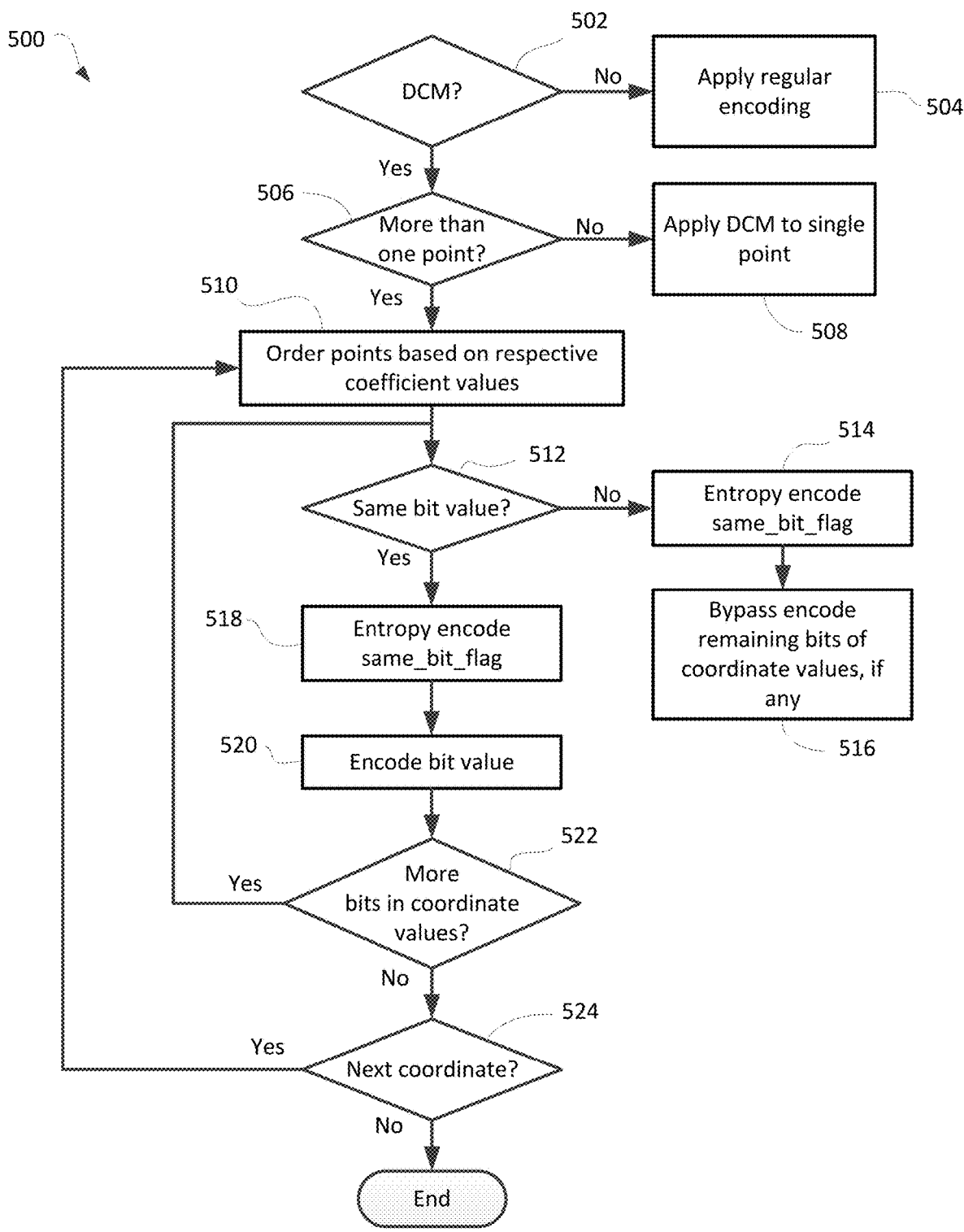
FIG. 5 shows a direct coding mode encoding process in flowchart form.

Reference is now made to FIG. 5, which shows a direct coding mode encoding process 500 in flowchart form. The process 500 is carried out by an encoder, which may be implemented using software containing processor-executable instructions that, when executed by one or more processing units, cause the processing units to carry out the described operations, in come examples. It will be appreciated that the process 500 is a sub-process within the larger overall point cloud encoding process. In some cases, the overall point cloud encoding process is a tree-based coding of occupancy status using a recursively partitioned volumetric space. As will be described, the process 500 is selectively applied in cases where a sub-volume qualifies for direct coding mode.

In operation 502, the encoder determines whether DCM is to be applied to the current sub-volume. As explained above, DCM may be conditional on there being fewer than a threshold number of points in the sub-volume. In some cases, DCM may also be conditional on the depth of the sub-volume in the coding tree. That is, DCM may not be enabled for some tree depths for which it would be unsuitable. If the encoder determines that DCM is not to be applied, e.g. if there more than a threshold number of points in the sub-volume, then in operation 504 the sub-volume's occupancy status is encoded using the usual point cloud encoding process.

If DCM applies, then in operation 506 the encoder assesses whether the sub-volume contains more than one point. If the sub-volume only contains one point, then the encoder encodes the location of that one point using the usual DCM coding process, as indicated by operation 508. However, if the sub-volume includes at least two points, then the multi-point DCM coding process of the present application may be applied.

As indicated by operation 510, the two points are ordered based on first coordinate values. The first coordinate values may be the x-direction values in some examples, although in other examples, the first coordinate values may be y-direction values or the z-direction values. Once ordered, then in operation 512 the encoder determines whether the bits in the same bit position in the two ordered coordinate values are the same. The process 500 begins with the most significant bit position as the current bit position. If the two bits in the current bit position, e.g. the most significant bit position in the first iteration, are the different, then they must be (0, 1) due to the ordering operation. Accordingly, in operation 514 the encoder entropy encodes a same bit flag signaling that the two bits are different, and then bypass codes the remaining bits of the two coordinate values in operation 516, if any.

If the two bits are determined to be the same in operation 512, then the encoder entropy encodes a same bit flag that signals that the two bits in the current bit position are the same in operation 518. The encoder then also encodes the bit value of those bits, i.e. whether they are both zero or both one, in operation 520. The encoding of the bit value may be bypass coding in some implementations.

In operation 522, the encoder evaluates whether there are more bits in the coordinate values. If so, then it advances the current bit position to the next or subsequent bit position, such as by incrementing a pointer or index, and returns to operation 512 to determine whether the bits in the new current bit position are the same or not. This pairwise encoding process repeats until either the two bits are not the same or until the full coordinate values are encoded and are identical, e.g. $x_1=x_2$. If the two coordinate values are identical, then in operation 524 the encoder determines whether it can apply the pairwise coding process to a next coordinate, such as the y-coordinate or z-coordinate for example. If so, then the process 500 returns to operation 510 to order the points based on the next coordinate.

In one variation of the above-described process 500 not illustrated, operation 510 may include coding a same value flag to signal whether the two coordinate values are identical or not. If identical, then the remainder of the process 500 may be applied to a next coordinate value. The same value flag may be entropy encoded in some cases.

Figure 6:
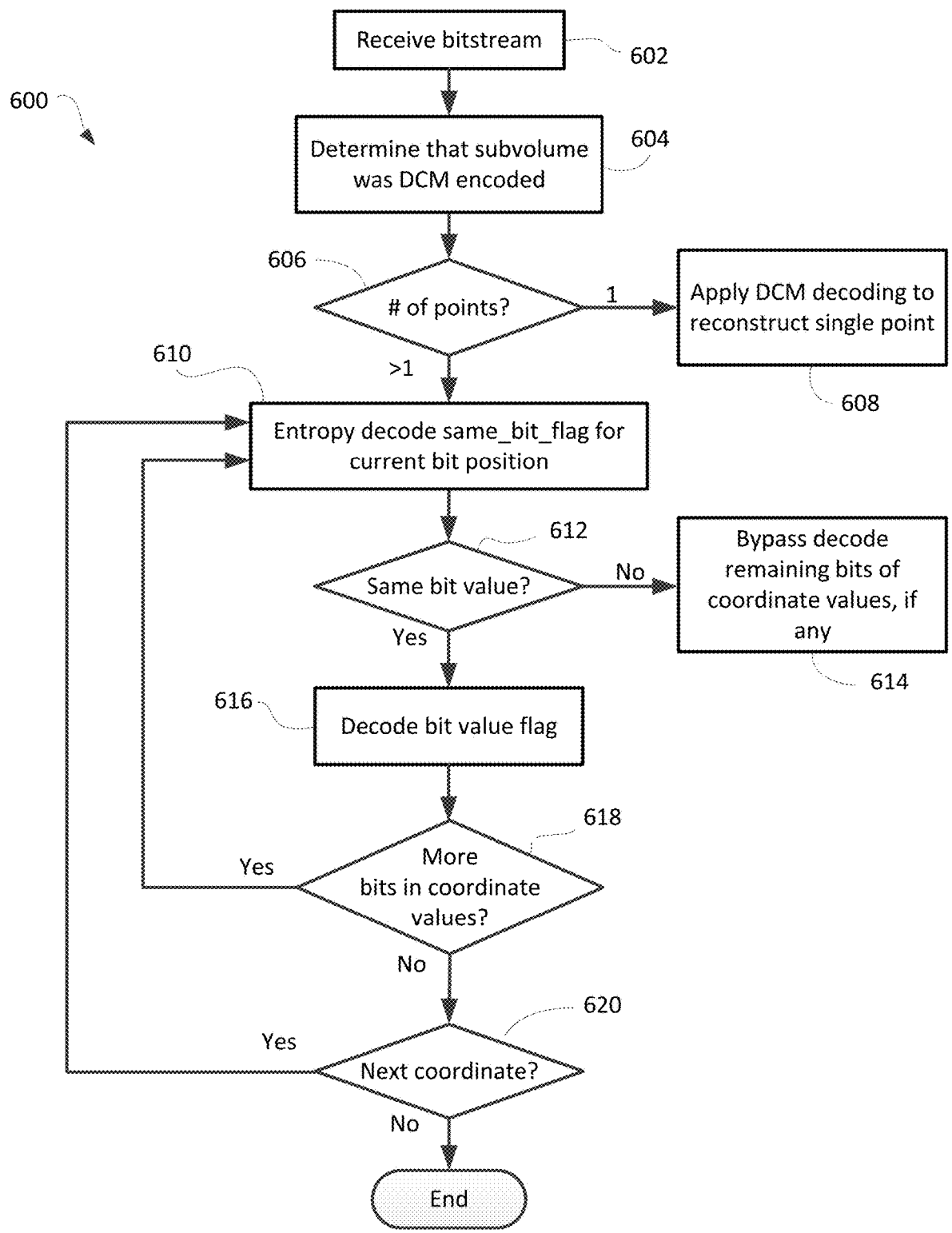
FIG. 6 shows a direct coding mode decoding process in flowchart form.

FIG. 6 illustrates an example direct coding mode decoding process 600 in flowchart form. The decoding process 600 may be carried out by a decoder, which in some implementations may be implemented by way of software containing processor-executable instructions that, when executed by one or more processors, cause the one or more processors to carry out the described operations.

In operation 602 the decoder receives a bitstream of encoded point cloud data. The bitstream may be received via a communication channel or read from a memory in some examples. It will be appreciated that portions of process 600 are implemented in the context of an overall point cloud decoding operation that result in output of a decoded point cloud. The decoded point cloud may be rendered and/or displayed in some cases or may be input to a further process, such as an object detection or collision warning process in some applications. The encoded data in the bitstream may be based on encoding of tree-based occupancy status information for a volumetric space.

In operation 604, the decoder determines that a current sub-volume was coded using DCM. In some examples this includes decoding a DCM flag that signals whether DCM was applied to the sub-volume. As described above, DCM may be applied to sub-volumes containing a number of points equal to or less than a threshold. In some cases, further eligibility criteria may be evaluated, for example the depth of the sub-volume in the coding tree. If the sub-volume is ineligible based on that criteria then no DCM flag is decoded because the sub-volume is ineligible.

Assuming that the sub-volume is eligible and the decoded DCM flag signals that DCM was applied, then in operation 606 the decoder determines the number of points in the sub-volume. This may include decoding a number of points value. If the threshold for DCM is two or fewer points, then operation 606 involves decoding a flag that signals whether there is one or two points in the sub-volume. If the threshold permits more than two points, then operation 606 involves decoding the number or the number-less-one, since the sub-volume cannot be empty.

If only one point is present in the sub-volume, then the decoded decodes the location data for the point using DCM as indicated by operation 608. If more than one point is present in the sub-volume then the present application applies the multi-point coding process described herein beginning with operation 610.

The decoder may assume that the encoder has ordered two coordinate values. The selected coordinate values may be pre-determined, e.g. the x-direction coordinate values may be selected by default, or may be signaled in the bitstream. The signaling of the coordinate values used in the process 600 may be in a header for the point cloud data or elsewhere in metadata relating to the point cloud. In operation 610, the decoder entropy decodes a same bit flag. As indicated by operation 612, the decoded same bit flag indicates whether the bits in the current bit position of the two coordinate values are identical or not. If not, then the decoder knows that the respective bits are (0, 1) based on the fact that the encoder would have ordered the points. Accordingly, the decoder reconstructs those bits, e.g. bits $b_{11}$ and $b_{21}$, as (0, 1) and bypass decodes the remaining bits of $x_1$ and $x_2$, if any, in operation 614. The length of the coordinate values will be known to the decoder based on the resolution of the coding tree and the depth of the sub-volume in the coding tree.

If the decode same bit flag signals that the two bits in the current bit position are the same, then in operation 616 the decoder decodes a bit value flag that signals whether the two bits are both zero or are both one. On that basis, the decoder reconstructs those bits, e.g. bits $b_{11}$ and $b_{21}$, as either (0, 0) or (1, 1). The decoder then, in operation 618, assesses whether there are any further bits in the coordinate values. If so, then it increments the current bit position to a subsequent or next bit position in the coordinate values and returns to operation 610 to decode another same bit flag relating now to the respective bits in the now current bit position.

If in operation 618 there are no further bits to decode for the coordinate values, then the coordinate values are identical. The decoder may then assess in operation 620 whether it can apply the pairwise decoding process to a next coordinate value. For example if the x-direction coordinate values were decoded as identical, then it may be configured to apply the process to the y-direction values on the basis that the encoder will have ordered the points based on the y-direction values and coded them using pairwise encoding. If so, then it returns to operation 610 to decode a same bit flag relating to the y-direction coordinate values.

The process 600 continues to be recursively applied until the coordinate values are non-identical, at which point remaining bits of a current coordinate value and any further coordinate values are bypass decoded.

The above-described examples use the case of two points for ease of illustration, but other embodiments of the process may be applied to the case of three or more points. As an example, joint coding of three points may be implemented. If there are three points in a sub-volume, and the three points have, for example, x-coordinate values, then the encoder may order them such that $x_1 \le x_2 \le x_3$.

Starting from the most-significant bit position, i.e. containing bits $b_{11}$ and $b_{21}$ and $b_{31}$, the bits will have the values (0,0,0), (0,0,1), (0,1,1), or (1,1,1). The 3-tuple of three bits cannot result in the values (0,1,0), (1,0,0), (1,0,1), or (1,1,0) since the points have been ordered to ensure that $x_1 \leq x_2 \leq x_3$. To code the bits, the encoder may apply the pairwise process as before with an addition flag to code whether the third bit, $b_3$, is zero or one in the case where the first two bits are the same and equal zero, e.g. (0,0,$b_3$).

Figure 7:
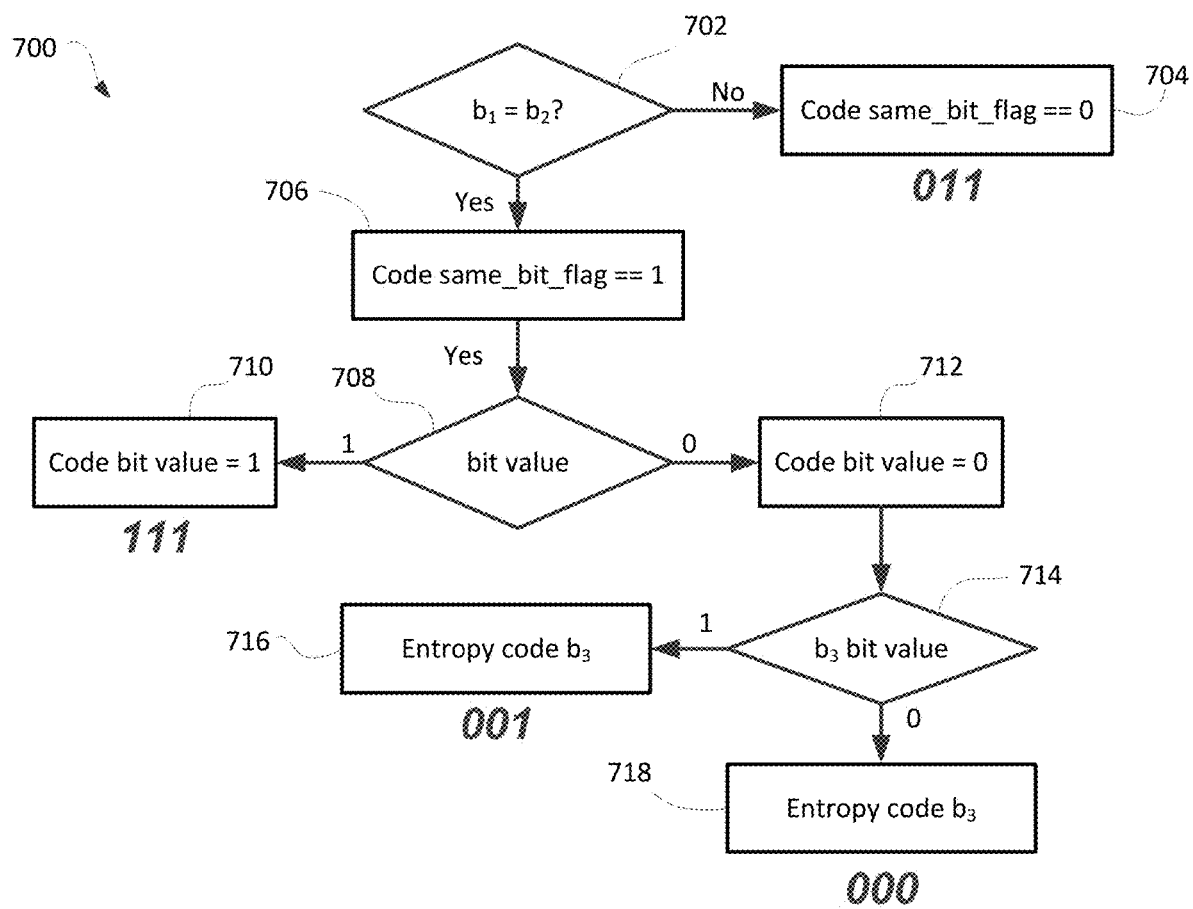
FIG. 7 shows a simplified flowchart of an example process for coding a 3-tuple of bits in a three-point DCM coding process.

FIG. 7 shows a simplified example process 700 for coding a 3-tuple of bits in the case of a three-point DCM coding process. The process 700 includes assessing whether $b_1$ and $b_2$ are the same in operation 702. If not the same, then the only possible 3-tuple is (0,1,1), so the same bit flag for $b_1$ and $b_2$ is encoded in operation 704 and the remaining bits are bypass encoded. If the first two bits are the same, then the same bit flag is encoded in operation 706 and the bit value flag is coded to signal if they are both 0 or both 1, as indicated by operations 708, 710, and 712. If they are both 1, then the 3-tuple is (1,1,1). If the first two bits are both zeros, then in operations 714, 716, and 718 the value of $b_3$ is encoded to signal whether the 3-tuple is (0,0,1) or (0,0,0).

Extension to a 4-tuple is straightforward. If $b_1$ and $b_2$ are not the same, then the 4-tuple is (0,1,1,1). If $b_1$ and $b_2$ are the same and are both 1, then the 4-tuple is (1,1,1,1). If they are both zero, and $b_3$ is 1, then the 4-tuple is (0,0,1,1). An extra flag coded (beyond those coded in the 3-tuple example) in the case where $b_1$, $b_2$, and $b_3$ are (0,0,0), in which case $b_4$ is encoded to signal that the 4-tuple is either (0,0,0,1) or (0,0,0,0). Further extension of the process to n-tuples will be appreciated in light of the above description.

Figure 8:
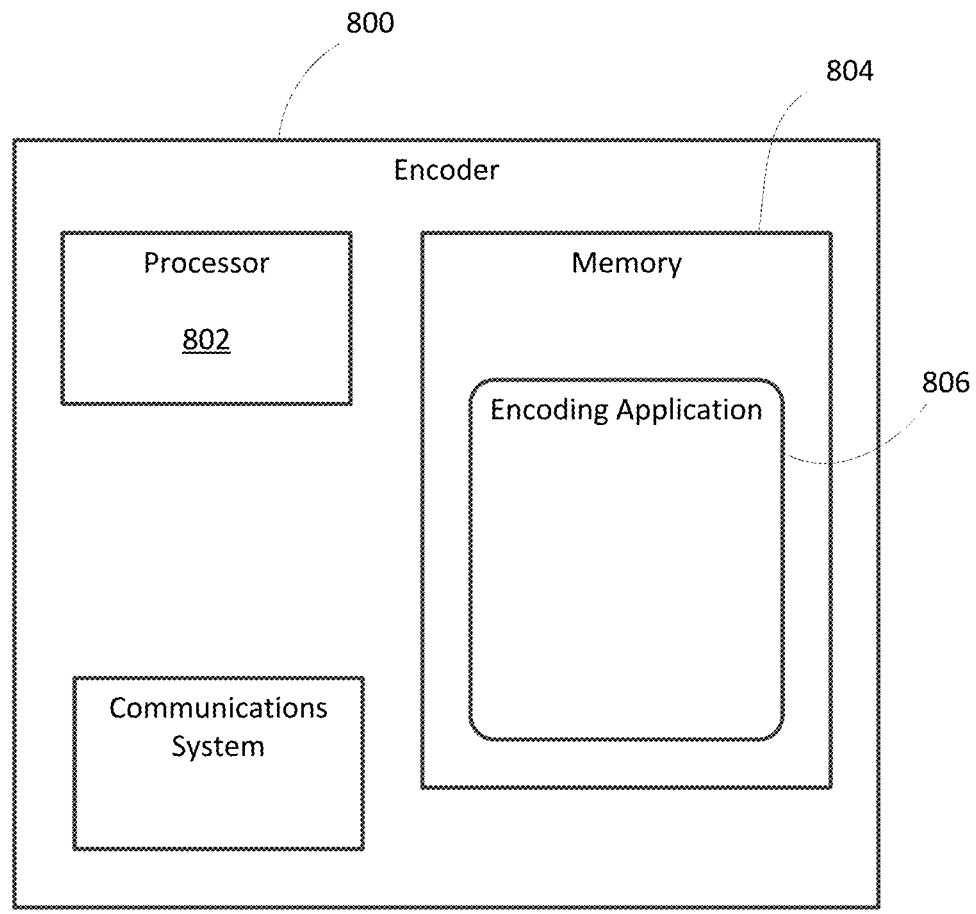
FIG. 8 shows an example simplified block diagram of an encoder.

Reference is now made to FIG. 8, which shows a simplified block diagram of an example embodiment of an encoder 800. The encoder 800 includes a processor 802, memory 804, and an encoding application 806. The encoding application 806 may include a computer program or application stored in memory 804 and containing instructions that, when executed, cause the processor 802 to perform operations such as those described herein. For example, the encoding application 806 may encode and output bitstreams encoded in accordance with the processes described herein. It will be understood that the encoding application 806 may be stored on a non-transitory computer-readable medium, such as a compact disc, flash memory device, random access memory, hard drive, etc. When the instructions are executed, the processor 802 carries out the operations and functions specified in the instructions so as to operate as a special-purpose processor that implements the described process(es). Such a processor may be referred to as a "processor circuit" or "processor circuitry" in some examples.

Figure 9:
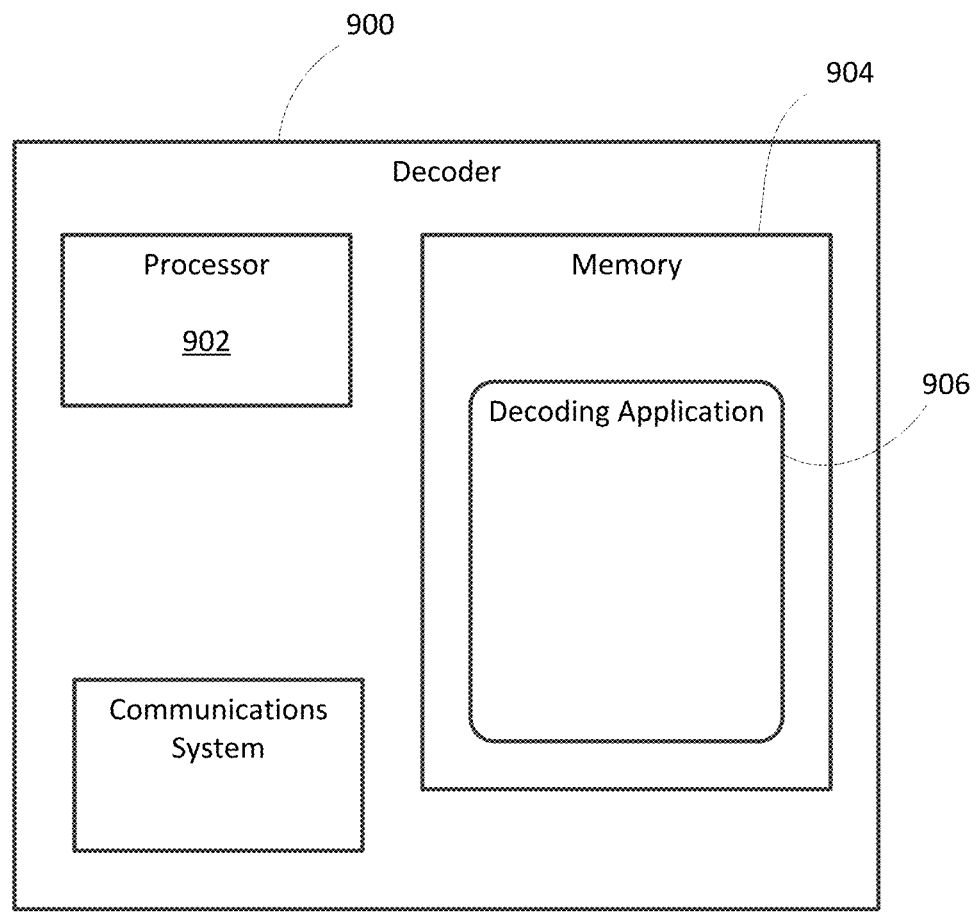
FIG. 9 shows an example simplified block diagram of a decoder.

Reference is now also made to FIG. 9, which shows a simplified block diagram of an example embodiment of a decoder 900. The decoder 900 includes a processor 902, a memory 904, and a decoding application 906. The decoding application 906 may include a computer program or application stored in memory 904 and containing instructions that, when executed, cause the processor 902 to perform operations such as those described herein. It will be understood that the decoding application 906 may be stored on a computer-readable medium, such as a compact disc, flash memory device, random access memory, hard drive, etc. When the instructions are executed, the processor 902 carries out the operations and functions specified in the instructions so as to operate as a special-purpose processor that implements the described process(es). Such a processor may be referred to as a "processor circuit" or "processor circuitry" in some examples.

It will be appreciated that the decoder and/or encoder according to the present application may be implemented in a number of computing devices, including, without limitation, servers, suitably-programmed general purpose computers, machine vision systems, and mobile devices. The decoder or encoder may be implemented by way of software containing instructions for configuring a processor or processors to carry out the functions described herein. The software instructions may be stored on any suitable non-transitory computer-readable memory, including CDs, RAM, ROM, Flash memory, etc.

It will be understood that the decoder and/or encoder described herein and the module, routine, process, thread, or other software component implementing the described method/process for configuring the encoder or decoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

The present application also provides for a computer-readable signal encoding the data produced through application of an encoding process in accordance with the present application.

Impact on Compression Performance

Testing using pairwise coding in the case of two points has been carried out with a number of example point clouds having different characteristics at different resolutions. The testing evaluated coding compression in bits-per-point ("bpp"), and coding complexity measured in terms of the number of tree nodes coded. The testing involved a current implementation of the Motion Picture Experts Group (MPEG) Test Model that uses IDCM, a variation of the Test Model that uses "simple" DCM without any implicit eligibility assessment and using simply a threshold-number-of-points test to determine whether DCM is to be applied, and an implementation of the present pairwise coding process for DCM.

The use of "simple" DCM result in a significant reduction of the number of tree nodes processed, e.g. speed increases and a reduction in memory requirements and memory access operations. In some tests, the number of nodes was reduced by a factor of 6. However, "simple" DCM also resulted an increase in bpp of anywhere from 0.1 to over 1.

The use of pairwise coding for DCM as described herein results in the same reduction in number of tree nodes (since the DCM application criteria were the same) but resulted in a bits-per-point value approximately the same as IDCM or, in some cases, a reduced bpp. Accordingly, not only do methods and systems using an embodiment of the present application result in much faster processing of point cloud data but, in some cases, they also provide compression gains.

Certain adaptations and modifications of the described embodiments can be made. Therefore, the above discussed embodiments are considered to be illustrative and not restrictive.

What is claimed is:

1. A method of encoding a point cloud to generate a bitstream of compressed point cloud data, wherein a current sub-volume contains a first point and a second point, the first point having a first location within the sub-volume defined by a first coordinate value and the second point having a second location within the sub-volume defined by a second coordinate value, the method comprising:
  ordering the first coordinate value and the second coordinate value wherein the first and second coordinate values are in binary;
  starting from a most significant bit position, pairwise encoding a current position of the first and second coordinate values by
    encoding a same bit flag indicating whether the bits in the current position in the first coordinate value and the second coordinate value are the same;
    when the bits in the current position are not the same, without encoding the bits in the current position, encoding any remaining bits of the first coordinate value and any remaining bits of the second coordinate value;
    when the bits in the current position are the same, then encoding a bit value flag indicating whether the bits are both one or both zero; and
  recursively repeating the pairwise encoding for a next position in the first and second coordinate values until the first and second coordinate values are encoded.

2. The method of claim 1, wherein encoding the same bit flag includes entropy encoding the same bit flag.

3. The method of claim 2, wherein entropy encoding the same bit flag uses a dedicated context for entropy encoding of the same bit flag.

4. The method of claim 1, wherein the first and second coordinate values correspond to direction in a Cartesian coordinate system.

5. The method of claim 4, wherein the direction is an x-direction, y-direction, or z-direction.

6. The method of claim 1, wherein the first location is further defined by a third coordinate value and the second location is further defined by a fourth coordinate value, the third and fourth coordinate values corresponding to a same direction in a coordinate system, wherein the method further comprises:
  determining that the first coordinate value and the second coordinate value are the same, and, as a result
    ordering the third coordinate value and the fourth coordinate value, and
    recursively performing the pairwise encoding with respect to the third and fourth coordinate values until they are encoded.

7. The method of claim 1, further comprising first determining that the sub-volume includes at least two points and determining that direct coding is to be applied to the at least two points.

8. The method of claim 7, wherein determining that direct coding is to be applied includes determining that the number of points in the sub-volume is less than a threshold number.

9. The method of claim 7, further comprising encoding a direct coding mode flag signaling that direct coding is used to encode the at least two points.

10. An encoder for encoding a point cloud to generate a bitstream of compressed point cloud data, wherein a current sub-volume contains a first point and a second point, the first point having a first location within the sub-volume defined by a first coordinate value and the second point having a second location within the sub-volume defined by a second coordinate value, the encoder comprising:
  a processor;
  memory; and
  an encoding application containing instructions executable by the processor that, when executed, cause the processor to;
    order the first coordinate value and the second coordinate value wherein the first and second coordinate values are in binary;
    starting from a most significant bit position, pairwise encode a current position of the first and second coordinate values by
      encoding a same bit flag indicating whether the bits in the current position in the first coordinate value and the second coordinate value are the same;
      when the bits in the current position are not the same, without encoding the bits in the current position, encoding any remaining bits of the first coordinate value and any remaining bits of the second coordinate value;
      when the bits in the current position are the same, then encoding a bit value flag indicating whether the bits are both one or both zero; and
    recursively repeat the pairwise encoding for a next position in the first and second coordinate values until the first and second coordinate values are encoded.

11. A method of decoding a bitstream of compressed point cloud data to produce a reconstructed point cloud, wherein a current sub-volume contains a first point and a second point, the first point having a first location within the sub-volume defined by a first coordinate value and the second point having a second location within the sub-volume defined by a second coordinate value, the method comprising:
  starting from a most significant bit position, pairwise decoding a current position of the first and second coordinate values by
    decoding a same bit flag indicating whether the bits in the current position in the first coordinate value and the second coordinate value are the same;
    when the bits in the current position are not the same, reconstructing the bits in the current position and decoding any remaining bits of the first coordinate value and any remaining bits of the second coordinate value;
    when the bits in the current position are the same, then decoding a bit value flag indicating whether the bits in the current position are both one or both zero;
  recursively repeating the pairwise decoding for a next position in the first and second coordinate values until the first and second coordinate values are decoded; and
  outputting a reconstructed first coordinate value for the first point and a reconstructed second coordinate value for the second point.

12. The method of claim 11, wherein decoding the same bit flag includes entropy decoding the same bit flag.

13. The method of claim 12, wherein entropy decoding the same bit flag uses a dedicated context for entropy decoding of the same bit flag.

14. The method of claim 11, wherein the first and second coordinate values correspond to direction in a Cartesian coordinate system.

15. The method of claim 14, wherein the direction is an x-direction, y-direction, or z-direction.

16. The method of claim 11, wherein the first location is further defined by a third coordinate value and the second location is further defined by a fourth coordinate value, the third and fourth coordinate values corresponding to a same direction in a coordinate system, wherein the method further comprises:
  determining that the first coordinate value and the second coordinate value are the same, and, as a result
  recursively performing the pairwise decoding with respect to the third and fourth coordinate values until they are reconstructed.

17. The method of claim 11, further comprising decode a direct coding mode flag signaling that direct coding was used to encode points in the sub-volume.

18. The method of claim 17, further comprising decoding a number of points value to determine that the number of points in the sub-volume is greater than one.

19. A decoder for decoding a bitstream of compressed point cloud data to produce a reconstructed point cloud, wherein a current sub-volume contains a first point and a second point, the first point having a first location within the sub-volume defined by a first coordinate value and the second point having a second location within the sub-volume defined by a second coordinate value, the decoder comprising:
  a processor;
  memory; and
  a decoding application containing instructions executable by the processor that, when executed, cause the processor to:
    starting from a most significant bit position, pairwise decode a current position of the first and second coordinate values by
      decoding a same bit flag indicating whether the bits in the current position in the first coordinate value and the second coordinate value are the same;
    when the bits in the current position are not the same, reconstructing the bits in the current position and decoding any remaining bits of the first coordinate value and any remaining bits of the second coordinate value;
    when the bits in the current position are the same, then decoding a bit value flag indicating whether the bits in the current position are both one or both zero;
    recursively repeat the pairwise decoding for a next position in the first and second coordinate values until the first and second coordinate values are decoded; and
    output a reconstructed first coordinate value for the first point and a reconstructed second coordinate value for the second point.

20. A non-transitory processor-readable medium storing processor-executable instructions for decoding a bitstream of compressed point cloud data to produce a reconstructed point cloud, wherein a current sub-volume contains a first point and a second point, the first point having a first location within the sub-volume defined by a first coordinate value and the second point having a second location within the sub-volume defined by a second coordinate value, wherein the instructions, when executed by a processor, cause the processor to
  starting from a most significant bit position, pairwise decode a current position of the first and second coordinate values by
    decoding a same bit flag indicating whether the bits in the current position in the first coordinate value and the second coordinate value are the same;
  when the bits in the current position are not the same, reconstructing the bits in the current position and decoding any remaining bits of the first coordinate value and any remaining bits of the second coordinate value;
  when the bits in the current position are the same, then decoding a bit value flag indicating whether the bits in the current position are both one or both zero;
  recursively repeat the pairwise decoding for a next position in the first and second coordinate values until the first and second coordinate values are decoded; and
  output a reconstructed first coordinate value for the first point and a reconstructed second coordinate value for the second point.

* * * * *